United States Patent [19]

Strathman et al.

[11] 4,371,774
[45] Feb. 1, 1983

[54] HIGH POWER LINEAR PULSED BEAM ANNEALER

[75] Inventors: Michael D. Strathman, Concord; Devendra K. Sadana, Berkeley; Richard B. True, Sunnyvale, all of Calif.

[73] Assignee: The United States of America as represented by the United States Department of Energy, Washington, D.C.

[21] Appl. No.: 210,488

[22] Filed: Nov. 26, 1980

[51] Int. Cl.$^3$ .................. B23K 15/00; H05H 7/06
[52] U.S. Cl. .................. 219/121 EA; 219/121 ER; 219/121 ES; 219/121 ET; 219/121 EU; 250/396 R; 250/396 ML; 250/492.3; 313/361.1; 313/363.1; 315/5.35; 315/5.41; 315/17
[58] Field of Search .................. 219/121 ET, 121 ES, 219/121 ER, 121 EU, 121 EV; 250/396 R, 492 B, 396 ML; 313/361, 363; 315/5.35, 5.41, 10, 14, 17

[56] References Cited

U.S. PATENT DOCUMENTS

| | | | |
|---|---|---|---|
| 3,708,722 | 1/1973 | Le Franc | 250/396 ML |
| 3,812,319 | 5/1974 | Brukousky | 219/121 EB |
| 3,999,097 | 12/1976 | Ko et al. | 219/121 EB |
| 4,038,484 | 7/1977 | Shrader et al. | 219/121 EB |
| 4,061,871 | 12/1977 | Sommerkamp et al. | 219/121 EB |
| 4,066,863 | 1/1978 | Doran et al. | 219/121 EM |
| 4,091,256 | 5/1978 | Friichtenicht | 219/121 L |
| 4,127,762 | 11/1978 | Paton et al. | 219/121 EM |
| 4,147,915 | 4/1979 | Sokolov et al. | 219/121 EB |
| 4,199,689 | 4/1980 | Takigawa | 250/492 A |
| 4,283,631 | 8/1981 | Turner | 250/492 B |

FOREIGN PATENT DOCUMENTS 2823829  12/1978  Fed. Rep. of Germany ...... 250/396 ML Primary Examiner—M. H. Paschall
Attorney, Agent, or Firm—Clifton E. Clouse, Jr.; Roger S. Gaither; Richard Besha

[57] ABSTRACT

A high power pulsed electron beam is produced in a system comprised of an electron gun having a heated cathode, control grid, focus ring, and a curved drift tube. The drift tube is maintained at a high positive voltage with respect to the cathode to accelerate electrons passing through the focus ring and to thereby eliminate space charge. A coil surrounding the curved drift tube provides a magnetic field which maintains the electron beam focused about the axis of the tube and imparts motion on electrons in a spiral path for shallow penetration of the electrons into a target. The curvature of the tube is selected so there is no line of sight between the cathode and a target holder positioned within a second drift tube spaced coaxially from the curved tube. The second tube and the target holder are maintained at a reference voltage that decelerates the electrons. A second coil surrounding the second drift tube maintains the electron beam focused about the axis of the second drift tube and compresses the electron beam to the area of the target. The target holder can be adjusted to position the target where the cross section of the beam matches the area of the target.

11 Claims, 5 Drawing Figures

HIGH POWER LINEAR PULSED BEAM ANNEALER

ORIGIN OF THE INVENTION

The invention described herein resulted from Contract W-7405-ENG-48 between the United States Department of Energy and the University of California.

BACKGROUND OF THE INVENTION

The invention relates to a high power pulsed electron beam system, and more particularly to a system for producing a pulsed, high current, electron beam from a hot cathode for annealing semiconductor devices at some point during their fabrication.

During the past few years, the use of electron radiation as a heat source for annealing ion-implantation damage in Si and GaAs has shown dramatic progress. With electron beam annealing, a higher degree of crystalline perfection can be achieved than with furnace annealing. But even if that were not the case, there are still numerous advantages over thermal heating. Surface annealing to any desired depth may be quickly achieved, and because only the surface of the semiconductor device requires annealing while still part of a wafer, there is less possibility of warping.

Crystalline defects within an implanted layer are eliminated if the depth of the melted layer exceeds that of the damaged surface layer and rapid growth occurs on an underlying single crystal substitute. It is the melting and subsequent rapid growth that is responsible for achieving improved crystalline perfection by annealing with a pulsed beam. The beam heats the crystal only to the desired depth, while the rest of the environment, including the crystal holder, remains cool. A pulsed beam annealer must therefore provide controlled beam energy density for uniform melting the surface layer to a desired depth.

The appropriate energy density required for pulsed annealing can be calculated, or determined empirically. In general, the energy density required for such annealing is related to the melting point of the semiconductor material and the depth of the layer to be melted. Since the depth is an important parameter, it is necessary to control the energy density. This can be done to a first order to magnitude by controlling the electron beam density, but for a higher order of control, it is necessary to also control the velocity of the electrons. It is therefore important to produce a controlled, high density beam that may be pulsed for fast, shallow heating with an electron beam having a linear wavefront that is uniform over the crystal surface, followed by fast cooling. The latter requires localized heating of only the crystal surface, and not the crystal holder and its environment.

OBJECTS AND SUMMARY OF THE INVENTION

An object of this invention is to produce a fast pulse of high density electrons from a hot cathode for heating a crystal to a desired depth without affecting the temperature of the crystal or crystal holder due to infrared radiation from the hot cathode, thereby allowing for fast cooling.

Another object of the invention is to provide a pulsed high power density electron beam from a hot cathode without space charge limitation.

Yet another object is to provide a pulsed electron beam having a linear wavefront for uniform shallow heating of a crystal.

These and other objects of the invention are achieved by a hot cathode electron gun comprised of a heated cathode, grid, and focus ring. The cathode source is gated with a fast pulse on its grid to emit a very short burst of electrons. An annular Faraday shield, sometimes referred to hereinafter as an "extractor," at the output of the gun is maintained at a high voltage with respect to ground (e.g., +70 kV) while the cathode and focus ring are maintained at a negative voltage (e.g., −20 kV). The large (90 kV) voltage difference between the cathode and extractor accelerates the electrons, thus eliminating any space charge limitation on the high emission of electrons from the hot cathode, thereby to produce a high density power beam. A curved focusing drift tube receives the accelerated electron beam and directs it toward a target that is not on the line of sight of the cathode so that the target and target holder will not receive any energy from the hot cathode other than from the pulsed electron beam emitted. That drift tube is also maintained at the same high voltage as the extractor. Another Faraday shield at the exit end of the drift tube is maintained at the same high voltage (+70 kV) as the extractor and drift tube.

Spaced a predetermined distance from this exit shield is a target holder that is maintained at ground potential (0V). Surrounding the target holder is a second drift tube, also at ground potential. This drop in electron beam potential of a predetermined amount (70 kV) from a high level (90 kV) to a low level (20 kV) decelerates the electrons to an appropriate velocity for impact with the target. During acceleration, and while traveling through the curved drift tube, the electron beam is bent and focused, and each electron is caused to drift in a spiral path, by a magnetic field produced by a coil around the tube. The spiral path imparts tangential velocity on the electrons impacting the target so that the target will absorb all of the energy near the surface. The voltage drop between the first and second drift tubes decelerates the electrons.

After deceleration, the electrons are compressed into a beam the size of the target area by a magnetic field from a coil around the second drift tube. The coils for the tubes are provided current for only a short time spanning the grid pulse interval, and the current for the second tube coil may be delayed until sometime just before the fast pulse on the grid, all for the purpose of minimizing the generation of heat in the magnetic field coils for the drift tubes.

The target is placed at the front of the second drift tube. The magnetic field of the first drift tube produces scallops in the profile of the electron beam being bent and focused. The magnetic field of the second drift tube, which compresses the beam during deceleration to the area of the target, blends with the magnetic field of the first drift tube and modifies the scalloped profile of the beam at the target only slightly. For fine adjustment of the match in beam cross section to target surface area, means are provided for adjusting the precise position of the target along the axis of the scalloped beam.

The novel features that are considered characteristic of this invention are set forth with particularity in the appended claims. The invention will best be understood from the following description when read on connection with the accompanying drawings.

Reference will now be made in detail to preferred embodiments of the invention, an example of which is illustrated in the accompanying drawings.

DESCRIPTION OF PREFERRED EMBODIMENTS

Figure 1:
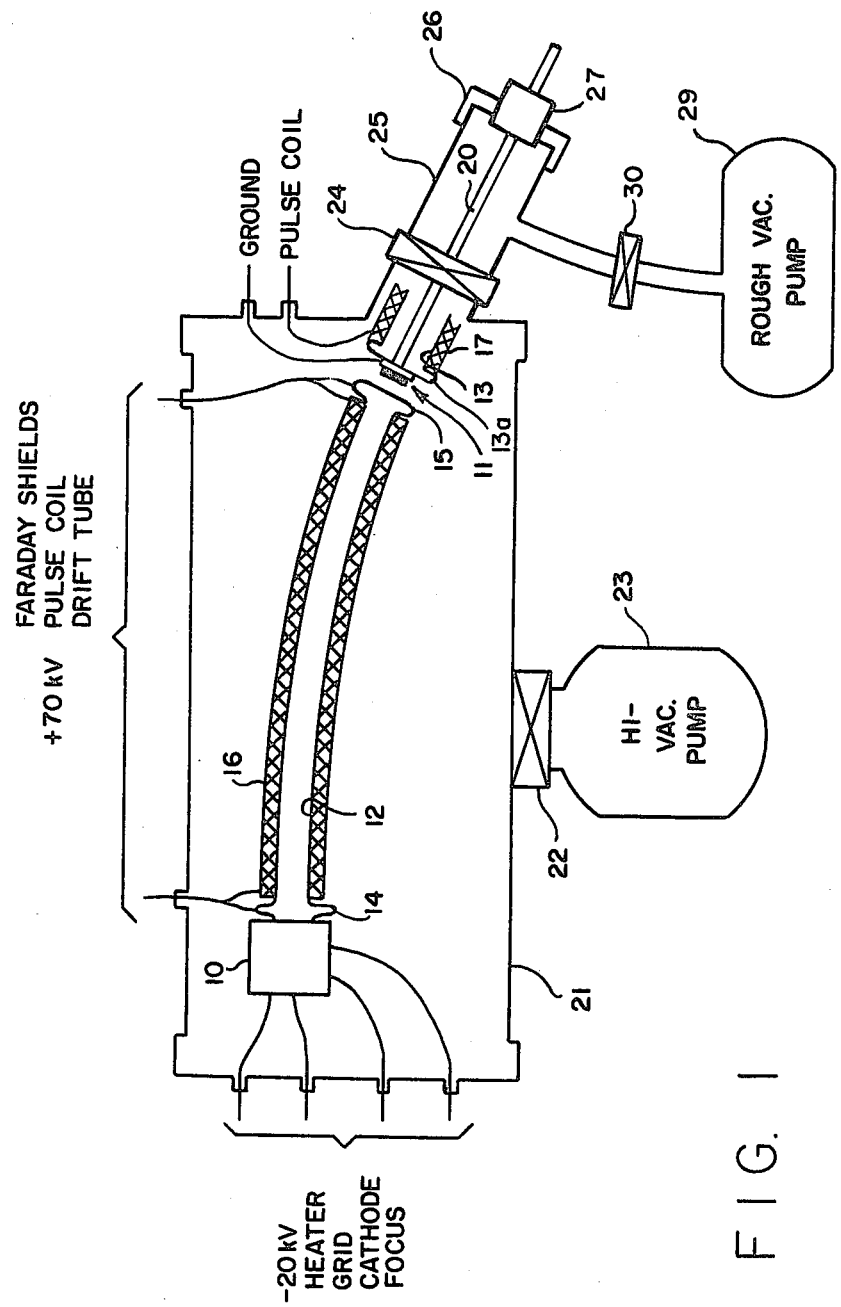
FIG. 1 is a system schematic diagram of a pulsed electron beam annealer according to the present invention.
Figure 2:
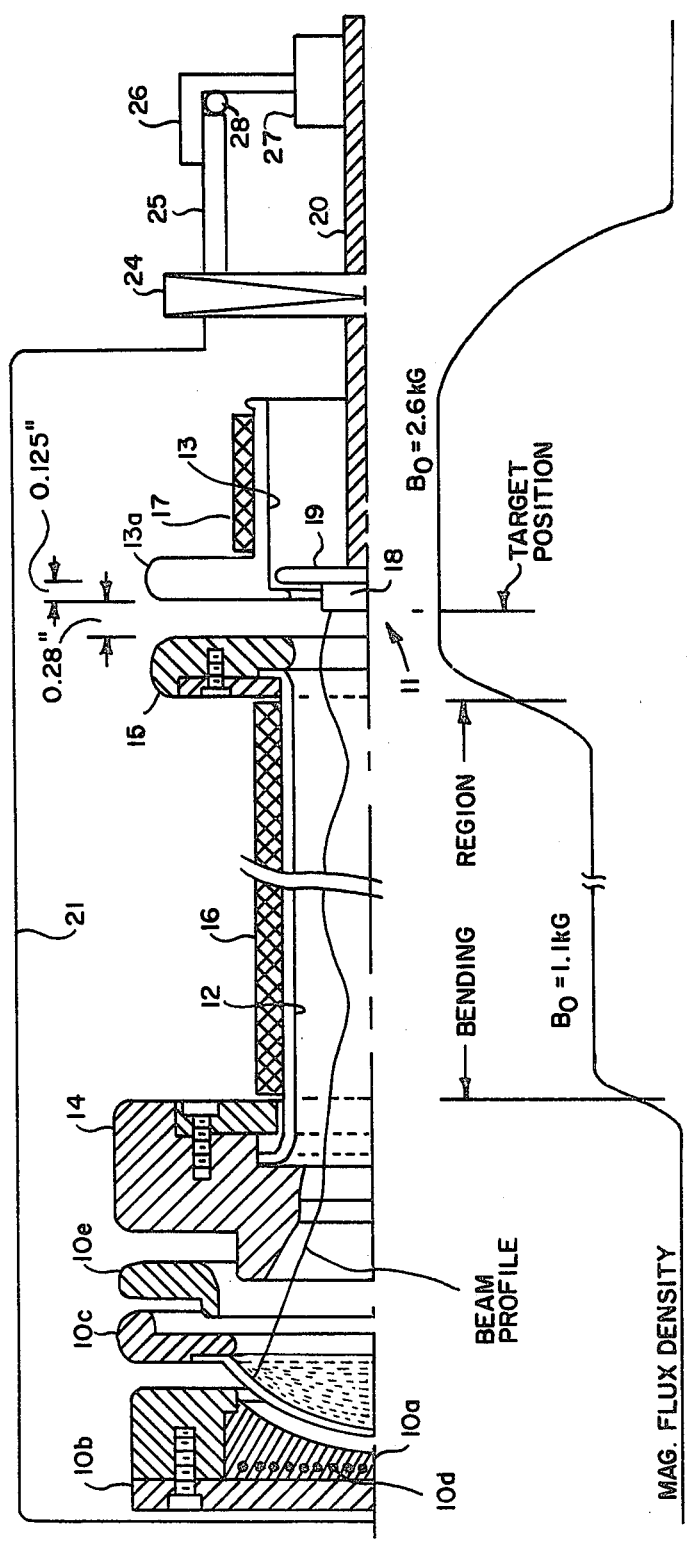
FIG. 2 is a more detailed schematic diagram of major parts of the system of FIG. 1, but shown with a straight accelerating drift tube for the convenience of showing below it the magnetic flux density along the drift tubes.

Referring now to the drawings, and particularly to FIGS. 1 and 2, a high power pulsed electron beam annealer is comprised of a hot-cathode electron gun 10 and a target holder 11 coupled to the electron gun by a curved drift tube 12, extending from the electron gun to very near the target, and a second straight drift tube 13 extending beyond the target position. Annular Faraday shields 14 and 15 at each end of the first tube, and a coil 16 surrounding that tube, are maintained at a high voltage of about +70 kV with respect to ground while the cathode 10a and support 10b (FIG. 2) are maintained at a negative voltage of about −20 kV. To produce a beam pulse, the electron gun is turned on for a very brief period by a pulse applied to a control grid 10c. The cathode is heated by imbedded tungsten wires 10d to provide a high current (typically 300 A/cm$^2$). A focus ring 10e at −20 kV confines the beam to the center of the annular Faraday shield 14 where the beam is accelerated. The control grid operates, with respect to the cathode between −1 kV for beam cutoff and +1.5 kV for full beam current.

The tube 12 is preferably a tin coated quartz tube of about 0.5 inch diameter with a radius of curvature of about 52.1 inches over an arc of about 7.94°. These dimensions will provide a drift tube of about 7.2 inches long with the top edge of its exit just below the bottom edge of its entrance so that a target at its exit will be out of the line of sight of the target. In that way, radiant energy from the hot cathode will not reach the target. This drift tube is also connected to the high voltage (+70 kV) through the Faraday shields to provide a high accelerating voltage of +90 kV for the electrons emitted from the gun. The second drift tube 13 is also made of quartz coated with tin. That tube and a coil 17 surrounding it are maintained at ground (0V). This decelerates the electrons from the high velocity imparted by +90 kV to a lower velocity corresponding to the voltage difference between the electron beam and the tube 13, which is 20 kV. In that manner, the high current electron beam is first accelerated by 90 kV (the difference between the cathode and first drift tube voltage) and then decelerated by 70 kV (the difference between the first and second drift tube voltages), leaving a 20 kV velocity. The high acceleration at the exit of the electron gun is to prevent space charge limitation on the beam current. The electron beam then is decelerated at the exit of the first tube to reduce the electron velocity and compress the beam to the area of the target, typically to a diameter of 0.5 cm (area of 0.196 cm$^2$).

Figure 3:
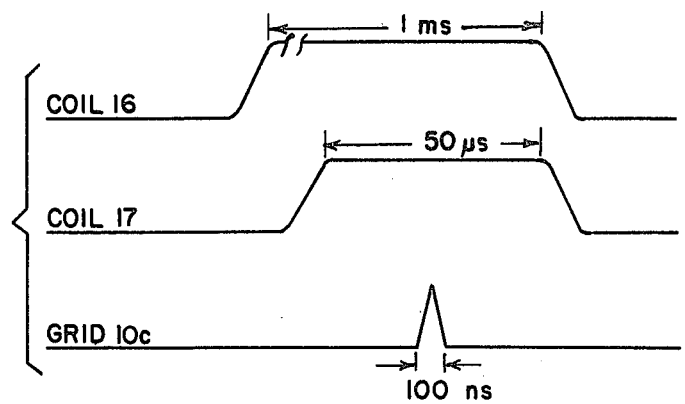
FIG. 3 is a timing diagram for the schematic field coils in the system of FIG. 1.

A current pulse is applied through the coils 16 to provide a unique magnetic field which focuses and bends the beam along the axis of the curved drift tube. This allows the target to be positioned off the line of sight from the cathode, as shown in FIG. 1. A delayed but otherwise concurrent pulse applied to the coil 17 compresses the beam to a predetermined area of the target 18. FIG. 3 illustrates the timing of these magnetic field pulses. First the coil 16 of the tube 12 is pulsed for about 1 ms, later the coil 17 of the tube 13 is pulsed for about 50 $\mu$s. Both current pulses terminate at the same time after the control grid of the electron gun is pulsed for about 100 ns at about the center of the 50 $\mu$s pulse.

Figure 4:
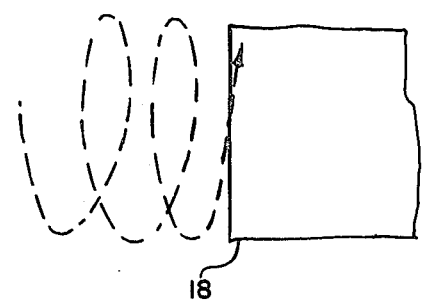
FIG. 4 is a diagram which illustrates the tangential velocity impact of electrons due to spiral motion imparted by the magnetic field along the accelerating drift tube to the target and a second drift tube at the target.
Figure 5:
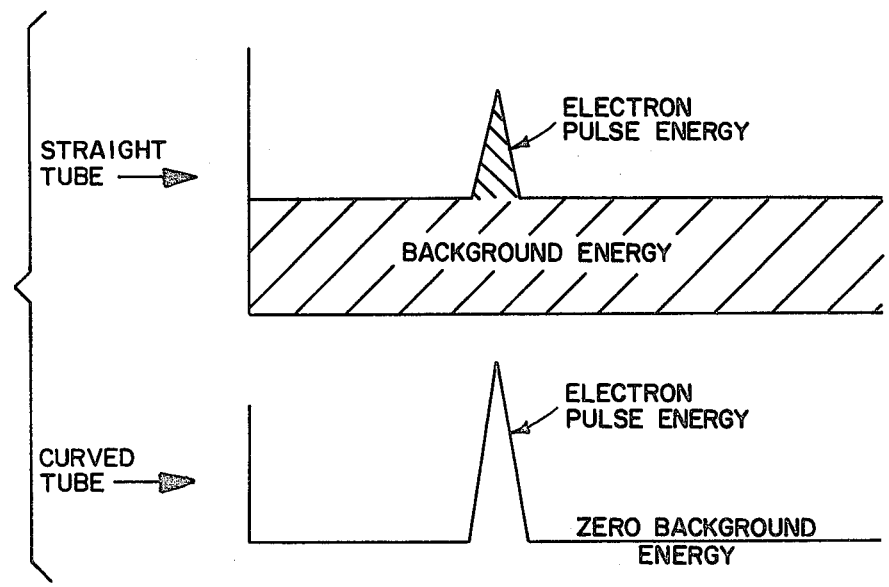
FIG. 5 is a target energy timing diagram which emphasizes the advantage of the curved accelerating drift tube.

While traveling through the first drift tube, each of the electrons is also imparted with a spiral motion in order that the electrons impact the target at a shallow angle for absorption of their energy near the surface of the target, as shown in FIG. 4. The diameter of the spiral path for each electron is, of course, much smaller than the diameter of the beam. This is referred to as imparting a "tangential velocity" to the electron. During deceleration, the magnetic field from the coil 17 of the second drift tube compresses the beam to a predetermined area.

FIG. 2 shows in a cross section the first drift tube 12 and coil 16 on a straight line with the second drift tube 13 and coil 17 in order to conveniently show below the cross section the magnetic flux density along the axis of the tubes, and to show the profile of the beam by a dashed line which represents the outer boundary of a cross section of the beam. Note the Bernoulli scallop of this profile. This is due to a mismatch of impedance between the electron gun and tube. While this may seem to be undesirable, and therefore to be avoided, the present invention takes advantage of it for fine adjustment of the beam to the predetermined area of the target by moving the target along the tube axis to a position where the cross section of the beam is of a diameter that just fits the target. In other words, advantage is taken of this Bernoulli scallop effect for fine adjustment of the beam diameter to the target diameter.

The space between the Faraday shield 15 and a flange 13a of the second drift tube 14 is set to 0.28", while a quartz holder 19 for the target 18 is set back about 0.125". The surface of the target is then placed in the exact position of a Bernoulli scallop for its size by adjustment of the target holder through a rod 20 which can be moved in the tube 13 along the tube axis.

FIG. 1 shows a vacuum chamber 21 for the high power pulsed beam annealer just described. That chamber is connected by a vacuum valve 22 to a high vacuum pump 23. Connected to the chamber 21 by a valve 24 is a vacuum interlock chamber 25 used to remove the target by withdrawing the target holder 19 into the interlock chamber 25, and then closing the valve 24. The valve 24 may be simply a gate valve having a V-shaped gate that is wedged tight against an o-ring on a valve seat on the side next to the chamber 21. Once the target holder is in the chamber 25, a cover 26 is removed from the end of the chamber, thus removing the rod and target holder from the chamber 25. The cover is provided with a vacuum seal 27 that maintains a high vacuum while allowing the rod to be moved axially through it.

To insert a new target into the tube 13, the procedure is reversed. First the target is mounted on the target holder while the target holder is near the cover 26. Then the cover is seated on the end of the chamber 25 with a vacuum seal. For example, the cover may be threaded onto the chamber 25. An o-ring 28 between the cover and the end of the chamber 25 provides a vacuum seal. Before the valve 24 is opened, a rough pump 29 (FIG. 1) is turned on to establish at least a partial vacuum in the chamber. Then a valve 30 is closed and the valve 24 is opened. Complete vacuum is then established in the chamber 25 through the valve 24 and chamber 21 by the high vacuum pump 23. The valve 22 connecting the pump 23 to the chamber 21 is closed only when that pump is to be turned off, which is while the annealer is not in use.

It should now be apparent that a high power pulsed electron beam is provided for annealing semiconductor surfaces using a hot cathode electron gun, a control grid, high accelerating voltage in a drift tube followed by a decelerating voltage at the exit of the drift tube, and a two-part magnetic field to bend, focus and compress the beam. The bend in the drift tube is so that the semiconductor mounted on a holder at the exit of the drift will be out of the line of sight of the hot cathode, i.e., so that the semiconductor tube will not receive any radiant energy from the hot cathode. The deceleration voltage reduces the electron energy and target penetration. During deceleration, and while traveling through a second drift tube in the second part of the two-part magnetic field, the electron beam is compressed to the area of the semiconductor surface that is to be heated for annealing.

Although particular embodiments of the invention have been described and illustrated herein, it is recognized that modifications and variations may readily occur to those skilled in the art. Consequently, it is intended that the claims be interpreted to cover such modifications and equivalents.

What is claimed is:

1. A high power pulsed electron beam system for annealing semiconductor surfaces to a predetermined depth comprising
    an electron gun having a hot cathode and a control grid for producing a beam of electrons in response to a control pulse,
    an extractor at the output of said gun maintained at a high voltage with respect to said cathode for accelerating electrons,
    a first drift tube having an input end and an exit end, said input end for receiving said accelerated electrons, and a first coil surrounding said tube to focus the electrons about the axis of the tube in response to a dc current pulse applied to said first coil for a time spanning said control pulse, said drift tube and coil being maintained at the same voltage as said extractor,
    a second drift tube axially aligned with the exit end of said first drift tube for receiving said accelerated and focused electrons, said second tube being spaced a predetermined distance from said first tube, and a second coil surrounding said tube to focus the electrons about the axis of the tube in response to a dc current pulse applied to said second coil for a time spanning said control pulse, the current of said second coil producing a magnetic field greater than the magnetic field produced by current through said first field, said second tube and coil being maintained at a reference voltage between the voltage of said cathode and said extractor,
    means for holding a semiconductor to be annealed with its surface positioned in the deceleration region, and within the magnetic field of said second tube, said holding means being maintained at said reference, and
    wherein said first drift tube is curved so that the exit end is off axis from the input end thereof, whereby said holding means positions a semiconductor to be annealed out of the line of sight of said cathode.

2. The combination of claim 1 wherein the magnetic field of said first drift tube produces a scalloped profile and the magnetic field of said second tube blends with the magnetic field of the first tube so as not to upset the scalloped profile, and wherein said holding means includes means for adjusting the position of said holding means to place the surface of a semiconductor to be annealed to a point in said beam focused by the magnetic field of said second tube where the cross section of the scalloped beam just fits the surface.

3. The combination of claim 1 wherein said first tube is fitted with a Faraday shield at the input end thereof.

4. The combination of claim 3 wherein said first tube is fitted with a Faraday shield at the output end thereof.

5. The combination of claim 1 further including means for pulsing said first coil for a predetermined time spanning a control pulse with a duration following a control pulse sufficient for a pulsed beam of electrons to reach said semiconductor, and means for pulsing said second coil for a predetermined time spanning a control pulse and terminating at the same time as the pulse of said first coil terminates.

6. Apparatus including a target for producing a high power pulsed electron beam of predetermined velocity at said target comprising
    an electron gun having a heated cathode and a grid adapted to be pulsed to cause a pulse of electrons to be emitted, and having a focus ring for confining the pulsed beam of electrons to a predetermined area, said cathode and focus ring being maintained at a negative voltage with respect to a reference voltage,
    a first drift tube having an input end and an exit end, said first drift tube having its axis aligned at said input end with the axis of said focus ring and an annular Faraday shield between said focus ring and drift tube, said first drift tube and Faraday shield being maintained at a high positive voltage with respect to said reference voltage to accelerate electrons passing through said focus ring, thereby eliminating space charge limitations on the emission of electrons from said gun,
    a coil surrounding said first drift tube, said coil conducting dc current for producing a magnetic field which maintains said electron beam focused about the axis of said first drift tube and imparts motion on electrons in a spiral path, and said coil being maintained at a voltage equal to the high voltage of said first drift tube,
    means for positioning said target at a predetermined distance beyond the end of said first drift tube, said means and target being maintained at said reference voltage, a second drift tube positioned with its axis aligned with the axis of said first drift tube at the exit end of said first drift tube, said second drift tube being maintained at said reference voltage, a second coil surrounding said second drift tube, said second coil conducting dc current for maintaining said electron beam focused about the axis of said second drift tube, and said second coil being maintained at said reference voltage to decelerate electrons passing from said first drift tube into said second drift tube, and wherein said target is to be heated on the surface by an electron beam pulse and quickly cooled, and wherein said first drift tube is curved to place said target in a position centered on the axis of the exit end of said first drift tube such that it is not in the line of sight from said heated cathode.

7. A high power pulsed electron beam apparatus as defined in claim 7 wherein said first and second drift tube coils are pulsed for a short time spanning the interval of said electron beam pulse traversing the distance from said grid to said target, thereby to minimize heating of said coils.

8. A high power pulsed electron beam apparatus as defined in claim 7 wherein said second drift tube coil is pulsed with a higher current than said first drift tube coil, and including a second annular Faraday shield at the exit end of said first drift tube, said second Faraday shield being maintained at a voltage equal to the voltage of said first drift tube, thereby to produce in the space between said first drift tube and said second drift tube a fast spatial rise of magnetic flux density from the exit end of said first drift tube toward said target.

9. A high power pulsed electron beam apparatus as defined in claim 8 wherein the start of the current pulse to said second drift tube coil is delayed with respect to the start of the current pulse to said first drift tube coil.

10. A high powered pulsed electron beam apparatus as defined in claims 6, 7, 8 or 9 wherein said target positioning means includes means for adjustment of target position along the axis of said second drift tube to position said target in order that its surface area so matches the cross section of the electron beam that a maximum of target surface is impinged by electrons and no electrons impinge said means for positioning said target.

11. A high power pulsed electron beam system for annealing semiconductors comprising a target holder, an electron gun having a heated cathode and control grid, and a focus ring for confining the pulsed beam of electrons to a predetermined area; a curved drift tube having its axis aligned with the axis of said focus ring; an annular Faraday shield between said focus ring and said curved drift tube, said annular Faraday shield and said curved drift tube being maintained at a high positive voltage with respect to said cathode to accelerate electrons passing through said focus ring, thereby eliminating space charge limitations on the emission of electrons from said gun, a dc current coil surrounding said curved drift tube to provide a magnetic field which maintains electrons focused about the axis of said curved drift tube, said curved drift tube having a curvature sufficient to place said target holder out of the line of sight of said cathode, and said target holder positioning a semiconductor to be annealed a predetermined distance beyond the end of said curved drift tube, a straight drift tube is positioned with its axis aligned with the axis of the curved drift tube and maintained at the reference voltage of the target holder to decelerate electrons passing from the first to the second drift tube, a second dc current coil surrounding said straight drift tube for maintaining the electron beam focused about the axis of the straight drift tube, and compressing the electron beam to the area of a semiconductor on said target holder.

* * * * *